United States Patent
Fox et al.

(10) Patent No.: US 6,566,697 B1
(45) Date of Patent: May 20, 2003

(54) PINNED PHOTODIODE FIVE TRANSISTOR PIXEL

(75) Inventors: Eric C. Fox, Waterloo (CA); Nixon O, Waterloo (CA)

(73) Assignee: Dalsa, Inc., Waterloo (CA)

( * ) Notice: Subject to any disclaimer, the term of this patent is extended or adjusted under 35 U.S.C. 154(b) by 0 days.

(21) Appl. No.: 10/044,975

(22) Filed: Jan. 15, 2002

Related U.S. Application Data

(63) Continuation-in-part of application No. 09/722,609, filed on Nov. 28, 2000.
(60) Provisional application No. 60/262,383, filed on Jan. 19, 2001.

(51) Int. Cl.⁷ .................... H01L 31/062; H01L 31/113
(52) U.S. Cl. ........................... 257/292; 257/291
(58) Field of Search ...................... 257/291, 292

(56) References Cited

U.S. PATENT DOCUMENTS

| | | |
|---|---|---|
| 5,051,797 A | 9/1991 | Erhardt |
| 5,146,480 A | 9/1992 | Sankaranarayanan et al. |
| 5,625,210 A | 4/1997 | Lee et al. |
| 5,760,723 A | 6/1998 | McGrath et al. |
| 5,841,159 A | 11/1998 | Lee et al. |
| 5,867,215 A | 2/1999 | Kaplan |
| 5,880,495 A | 3/1999 | Chen |
| 5,881,184 A | 3/1999 | Guidash |
| 5,900,623 A | 5/1999 | Tsang et al. |
| 5,903,021 A | 5/1999 | Lee et al. |
| 5,904,493 A | 5/1999 | Lee et al. |
| 5,923,794 A | 7/1999 | McGrath et al. |
| 5,986,297 A | 11/1999 | Guidash et al. |
| 6,002,123 A | 12/1999 | Suzuki |
| 6,002,432 A | 12/1999 | Merrill et al. |
| 6,021,172 A | 2/2000 | Fossum et al. |
| 6,023,081 A | 2/2000 | Drowley et al. |
| 6,026,964 A | 2/2000 | Hook et al. |
| 6,027,955 A | 2/2000 | Lee et al. |
| 6,046,444 A | 4/2000 | Afghahi |
| 6,051,447 A | 4/2000 | Lee et al. |
| 6,069,377 A | 5/2000 | Prentice et al. |
| 6,084,259 A | 7/2000 | Kwon et al. |
| 6,100,551 A | 8/2000 | Lee et al. |
| 6,100,556 A | 8/2000 | Drowley et al. |
| 6,115,065 A | 9/2000 | Yadid-Pecht et al. |
| 6,130,713 A | 10/2000 | Merrill |
| 6,163,023 A | 12/2000 | Watanabe |
| 6,180,969 B1 | 1/2001 | Yang et al. |
| 6,323,476 B1 * | 11/2001 | Guidash et al. ............ 250/208.1 |
| 6,326,230 B1 | 12/2001 | Pain et al. |
| 6,410,899 B1 * | 6/2002 | Merrill et al. ............. 250/208.1 |
| 6,498,331 B1 * | 12/2002 | Kozlowski et al. ......... 250/208.1 |
| 6,512,544 B1 * | 1/2003 | Merrill et al. ............... 348/302 |

FOREIGN PATENT DOCUMENTS

| | | |
|---|---|---|
| EP | 0 854 516 A2 | 7/1998 |
| JP | 55-138026 | 10/1980 |
| JP | 4-357872 | 12/1992 |
| WO | WO 00/52765 | 9/2000 |

* cited by examiner

*Primary Examiner*—Ngân V. Ngô
(74) *Attorney, Agent, or Firm*—Dorsey & Whitney, LLP

(57) ABSTRACT

A pixel includes five transistors, a pinned photodiode and a storage node. A first transistor is coupled between the pinned photodiode and the storage node. A second transistor is coupled between the storage node and an output drain voltage. A third transistor is coupled between the pinned photodiode and a pixel reset voltage. The pixel reset voltage is different than the output drain voltage.

9 Claims, 14 Drawing Sheets

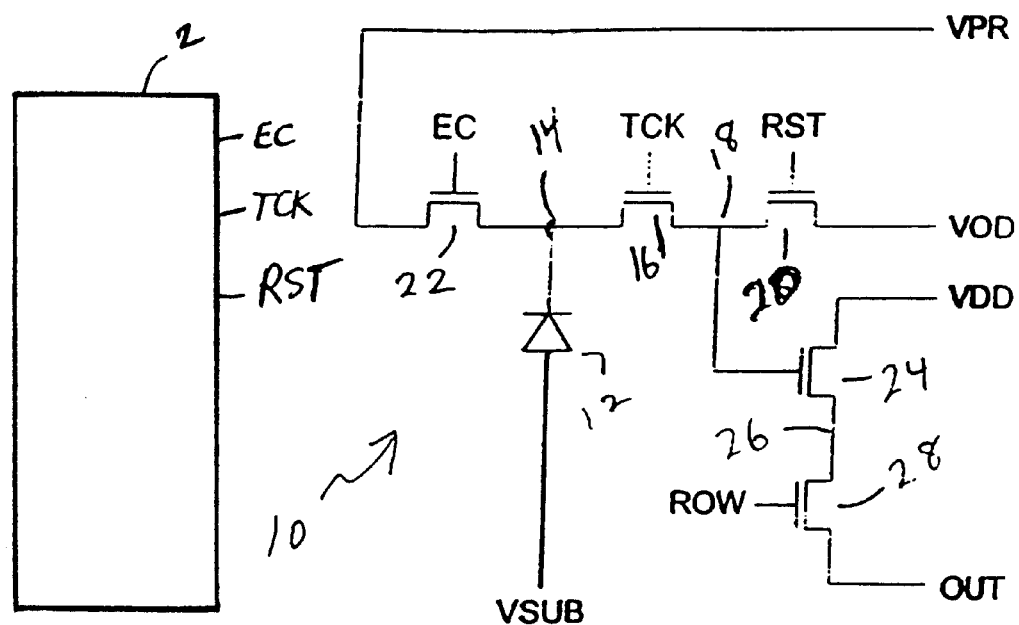
Fig. 1 –

Signal Integration

Signal Transfer

Immediately Post Signal Transfer

Immediately After Signal Transfer

Exposure Control Enabled

Photosite Hard Reset

Photosite Soft Reset

Signal Integration

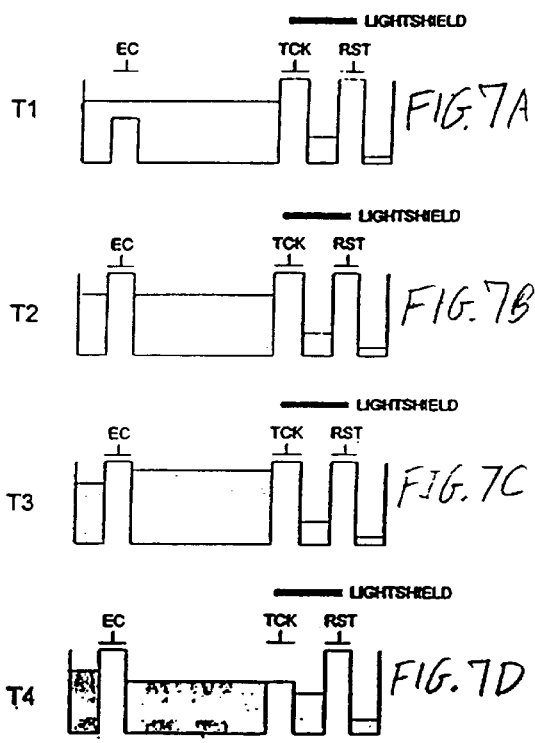
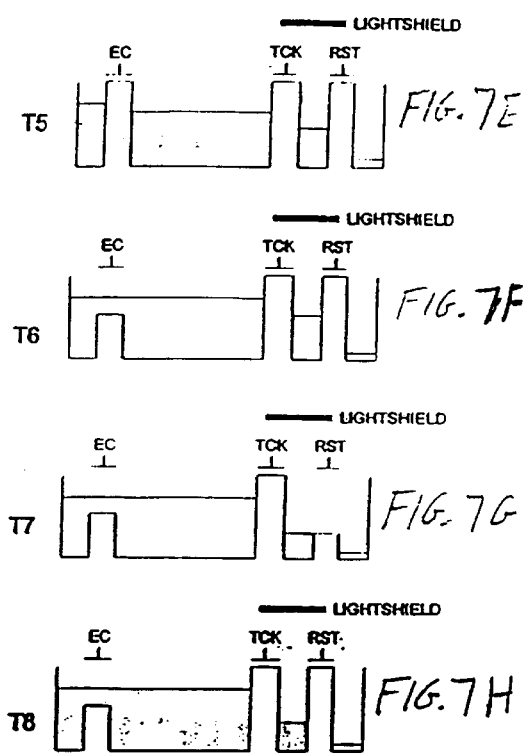

PINNED PHOTODIODE FIVE TRANSISTOR PIXEL

This application is a continuation-in-part of U.S. patent application Ser. No. 09/722,609 filed Nov. 28, 2000, and claims the priority benefit thereof. The priority benefit of the Jan. 19, 2001 filing date of provisional application serial No. 60/262,383 is also hereby claimed.

BACKGROUND OF THE INVENTION

1. Field of the Invention

The present invention relates to a novel pinned photodiode pixel architecture and method of using the pixel for high-speed motion-capture CMOS image sensors. In particular, the invention relates to a pinned photodiode used in a five-transistor pixel so that the channel region of the photodiode is completely voided of charge after reset and readout operations.

2. Description of Related Art

CMOS image sensors first came to the fore in relatively low-performance applications where shuttering was not required, scene dynamic range was low, and moderate to high noise levels could be tolerated. Pixels were based on simple diode architectures, and the pixel circuits were based on the minimum gate count required for bussing and buffering (usually 3). Although these early sensors offered a route to low total system costs (integration of all camera functionality on a single chip) and low power dissipation, the pixel architectures did not allow for low reset noise, snapshot image capture, and antiblooming/exposure control. As the art progressed, pixels were developed with four transistors and with pinned photodiode (PPD) photosites. These advancements allowed for shuttered operation with low reset noise. However, they did not allow antiblooming or exposure control. In U.S. patent application Ser. No. 09/722,609, titled "Five Transistor CMOS Pixel", incorporated herein by reference, a photosite is disclosed that could be realized with either a conventional photodiode or with a PPD in which an additional transistor allows for snapshot operation with antiblooming and exposure control.

FIGS. 2A and 2B are circuit schematics of conventional CMOS pixels known as a 3T pixel (for three-transistor pixel) and a 4T pixel (for four-transistor pixel). The 3T pixel has a reverse-biased photodiode coupled between substrate voltage VSUB and the reset gate transistor. When operated, an RST signal applied to the electrode of the reset gate transistor causes a reverse bias equal to output drain voltage VOD less VT to be set on the photodiode. Between drain supply VDD and output signal terminal OUT are coupled two series transistors. The drain of the first transistor is coupled directly to VDD, and a gate of the first transistor is coupled to the cathode of the photodiode so that the first transistor operates as a source follower. The source of the source follower transistor is coupled through a row transistor to output terminal OUT. In applications, a plurality of such 3T pixels are coupled to the same output terminal OUT. By selectively applying row address signal ROW to the gate of the selected row transistor, different pixels can be coupled to output terminal OUT.

The 4T pixel (FIG. 2B) is like the 3T pixel (FIG. 2A) except that the 4T pixel has a transfer gate transistor coupled between the reset transistor and the photodiode so that a sense node may be created between the transfer gate transistor and the reset transistor. The sense node may be isolated from the photosite.

There is a need to capture fast-changing scenes without the intrusion of a "rolling shutter" artifact while at the same time allowing for antiblooming and/or exposure control functionality. Further, there is a need to operate the pixel without image lag and with minimal fixed pattern noise due to variations in the fat zero signal. Known cameras use external shutters, mechanical or otherwise, to eliminate the rolling shutter artifacts.

U.S. Pat. No. 5,900,623 to Tsang et al. describes a five transistor pixel with two transistors arranged as a differential pair. However, operation of the Tsang et al. pixel requires that complementary signals be applied to FETs in a differential configuration, and that photocharge be accumulated on capacitor MCAP at a drain of one of the differentially configured FETs. The Tsang et al. pixel does not allow for electronically "shuttered" image acquisition. Further, Tsang et al does not describe a 5T pixel using a pinned photodiode so that the channel region of the photodiode is completely voided of charge after reset and readout operations.

U.S. Pat. No. 6,115,065 to Yadid-Pecht and Fossum describes a pixel with four transistors and a photogate in a configuration of a 4T pixel. This pixel does not provide protection against a rolling shutter artifact (as described herein) at the same time as antiblooming and exposure control. Further, Yadid-Pecht and Fossum does not describe a 5T pixel using a pinned photodiode so that the channel region of the photodiode is completely voided of charge after reset and readout operations.

U.S. Pat. No. 6,002,123 to Suzuki describes a 4T pixel. However, the pixel does not provided antiblooming functionality at the same time as it provides protection against the rolling shutter artifact. Further, Suzuki does not describe a 5T pixel using a pinned photodiode so that the channel region of the photodiode is completely voided of charge after reset and readout operations.

U.S. Pat. No. 5,760,723 to McGrath et al. describes a CCD spill well architecture that makes use of a fill and spill methodology. Further, McGrath et al. does not describe a 5T pixel using a pinned photodiode so that the channel region of the photodiode is completely voided of charge after reset and readout operations.

SUMMARY OF THE INVENTION

It is an object to the present invention to provide a pixel compatible with CMOS processing technology. It is another object of the present invention to provide a pixel that can be voided of photo charges.

These and other objects are achieved in a pixel that includes five transistors, a pinned photodiode and a storage node. A first transistor is coupled between the surface pinned photodiode and the storage node. A second transistor is coupled between the storage node and an output drain voltage. A third transistor is coupled between the pinned photodiode and a pixel reset voltage.

In an alternative embodiment, the pixel reset voltage is different than the output drain voltage.

These and other objects are also achieved by a method of sensing radiation in a pixel. The method includes steps of applying an exposure control clock signal to a gate electrode of an exposure control transistor of a five-transistor pixel, applying a pixel preset voltage to a drain of the exposure control transistor, and switching the exposure control clock signal to a low state at a beginning of an integration cycle.

These and other objects are also achieved by a method that includes steps of draining all charge from a pinned photodiode in a five transistor pixel into a preset drain before a beginning of an integration cycle and isolating the pinned photodiode at the beginning of the integration cycle. The method also includes a step of transferring all charge from the pinned photodiode into a storage node at an end of the integration cycle.

These and other objects are also achieved by a method of using a five transistor pixel. The method includes steps of draining all of a prior charge from a pinned photodiode through an exposure control gate transistor of the five transistor pixel and integrating a first charge on the pinned photodiode during an integration fraction of a first readout interval.

These and other objects are also achieved by another method of using a five transistor pixel. The method includes steps of integrating a first charge on a pinned photodiode of the five transistor pixel during an integration fraction of a first readout interval and transferring all of the first charge from the pinned photodiode to a storage node at an end of the first readout interval.

These and other objects are also achieved by a sensor that includes control circuitry and a pixel that includes five transistors, a pinned photodiode and a storage node. In the sensor, a first transistor is coupled between the pinned photodiode and the storage node. Additionally, a second transistor is coupled between the storage node and an output drain voltage. Further, a third transistor is coupled between the pinned photodiode and a pixel reset drain. The control circuitry is capable of controlling the third transistor to drain all of a prior charge from the pinned photodiode. Moreover, the control circuitry is further capable of controlling the first and the third transistor to integrate a first charge on the pinned photodiode during an integration fraction of a first readout interval.

These and other objects are also achieved by another method of sensing radiation in a pixel. The method includes steps of applying an exposure control clock signal to a gate electrode of an exposure control transistor of a five transistor pixel, switching the exposure control clock signal to a low state at a beginning of an integration cycle, and applying a transfer clock signal to a gate electrode of a transfer gate transistor at an end of the integration cycle.

BRIEF DESCRIPTION OF DRAWINGS

The invention will be described in detail in the following description of preferred embodiments with reference to the following figures wherein:

FIG. 1 is a circuit schematic of a five-transistor pixel sensor according to the present invention;

FIGS. 7A through 7H are potential diagrams of the sense node reset timing and its place in the pixel sensing cycle;

Figure 2A:
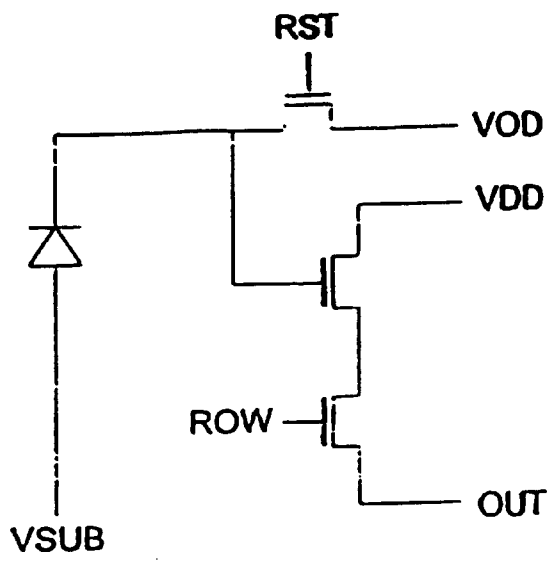
FIGS. 2A and B are circuit schematics of known three- and four-transistor pixels, respectively.

The potentials depicted in FIGS. 3A through 3H and 7A through 7H use conventional n-channel potential diagrams. In these diagrams, more positive potentials are depicted toward the bottom of the figure, and less positive potentials are depicted toward the top of the figure. For example, a zero voltage reference may be depicted at the top of the potential diagram, and a +3 volt signal would be a step down toward the bottom of the figure with respect to the zero volt reference. A +5 volt signal would be a further step down toward the bottom of the figure with respect to both the +3 volt signal and the zero volt reference.

DETAILED DESCRIPTION OF PREFERRED EMBODIMENTS

The surface gated or pinned photodiode pixel (also referred to as a PPD pixel) of the present invention permits a photosite of a five-transistor pixel (also referred to as a 5T pixel) to be completely emptied of charge (i.e., reset) to permit a noise-free exposure control operation. A surface gated photodiode is a pinned photodiode. A pinned photodiode is similar to a field-effect transistor (FET) with a gate electrode replaced by a pinning layer that is set to a fixed potential based on the doping of the pinning layer; hence the term "surface gated". In order to appreciate the present invention, it is first necessary to understand the preferred operation of a 5T pixel.

In FIG. 1, a 5T pixel includes a light shield (not shown in FIG. 1 for clarity) disposed over the top of a sense node (i.e., junction 18 also called storage node) and exposure-control gate transistor 22 coupled to the photosite. The sense node (junction 18) includes the diode region between reset gate transistor 20 and transfer gate transistor 16. However, the light shield (not shown in the circuit schematic for clarity) prevents generation of photo charge in the sense node. Advantages of this pixel are that the pixel can be implemented in such a way that the "rolling shutter" artifact associated with conventional CMOS image sensors can be eliminated while at the same time allowing for antiblooming (AB) operation and electronic exposure control (EC) operation. In contrast, a "4T" pixel can be operated to either eliminate rolling shutter problem or allow for AB/EC functionality, but not both at the same time.

Another feature of the 5T pixel is the specific timing and biasing sequence used such that this pixel can be operated with both low lag and low fixed pattern noise.

In FIG. 1, the 5T pixel 10 includes a photodetector that, in this example, includes a reverse-biased photodiode 12 coupled between substrate voltage VSUB and junction 14. In the present embodiment, photodiode 12 is a pinned photodiode (PPD), the advantage of which to the 5T pixel are described herein. Transfer gate transistor 16 is coupled between junctions 14 and 18 and has a gate electrode controlled by transfer clock TCK. Reset gate transistor 20 is coupled between junction 18 and drain voltage VOD and has a gate electrode controlled by reset clock RST. Exposure-control transistor 22 is coupled between junction 14 and preset voltage VPR and has a gate electrode controlled by exposure control voltage EC. Source follower transistor 24 is coupled between drain voltage VDD and junction 26 and has a gate electrode coupled to junction 18. Row address transistor 28 is coupled between junction 26 and pixel output terminal OUT and has a gate electrode coupled to row addressing voltage ROW. A plurality of such pixels 10 are connected to output terminal OUT. However, the row-addressing voltage ROW from only one pixel at a time is permitted to couple a signal from junction 26 to output OUT.

In general operation, exposure control transistor 22 sets voltage VPR on junction 14 while either the transfer gate transistor, the reset gate transistor, or both are turned off. Then, photocharge is integrated on junction 14 and subsequently transferred to junction 18 where it is provided to the gate electrode of source follower 24.

If photodiode 12 were not a pinned photodiode, but instead was an ordinary photodiode, then a hard/soft reset process for photosite 14 would be required to achieve a sensor with low fixed pattern noise. The hard/soft reset process is described in more detail below. The detailed method of operation of a hard/soft reset is complicated. The photosite is first "hard" reset with a dc bias (e.g., voltage VPR), and is then "soft" reset by spilling excess charge over exposure control gate transistor 22 to the VPR drain. CCD image sensors, in contrast to CMOS sensors, use a related technique referred to as "fill and spill".

Figure 3A:
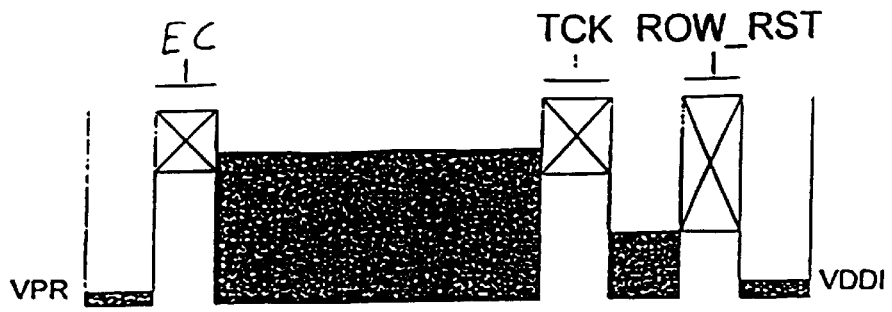
FIGS. 3A through 3C are potential diagrams illustrating collected charge transfer from the photosite to the sense node according to the invention.
Figure 3B:
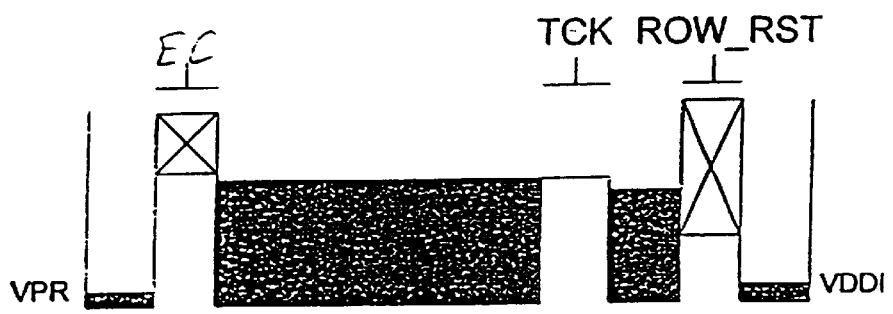
Figure 3C:
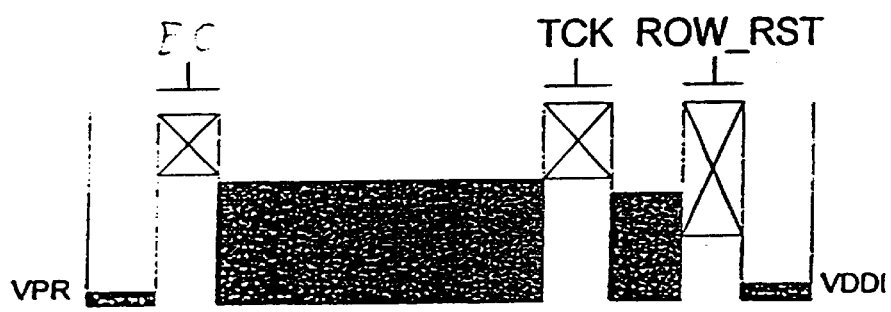

The hard/soft reset operation of the 5T pixel with ordinary photodiode as photodiode 12 is illustrated in FIGS. 3A through 3C. The integration and transfer operations are illustrated in FIG. 3A. This is what eliminates the rolling shutter artifact.

In FIG. 3A, the photosite (e.g., junction 14 or the well between exposure control gate transistor 22 and transfer gate transistor 16) has been integrating photocharge for a period of time. In FIG. 3B, TCK is clocked high to turn on transfer gate transistor 16 and cause the photocharge to be transferred to the sense node (e.g., junction 18 or the well between transfer gate transistor 16 and reset gate transistor 20) which is also a part of pixel 10. In FIG. 3C, TCK is clocked back to low to turn off transfer gate transistor 16. The photocharge is now stored on the sense node (i.e., junction 18) for readout. The sense node is covered with a light shield (not shown for clarity) and hence the photosite (junction 14) can immediately begin to accumulate photocharge from the next exposure period without altering the charge stored on the sense node (i.e., junction 18). In practice, the photosite to sense node transfer operation will take place for all pixels in the frame at the same time, thus obviating any opportunity for a rolling shutter artifact. After the transfer operation, the individual sense nodes (18) can be read out in sequence.

This architecture eliminates the "rolling shutter" phenomenon associated with conventional CMOS pixels (e.g., the "3T" pixel illustrated in FIG. 2A). The rolling shutter issue can be described with the aid of FIGS. 4A, 4B, 5A, 5B, 6A and 6B. These FIGS. illustrate the sequence of row readouts and the associated integration times sensed by each row in the array.

Figure 6A:
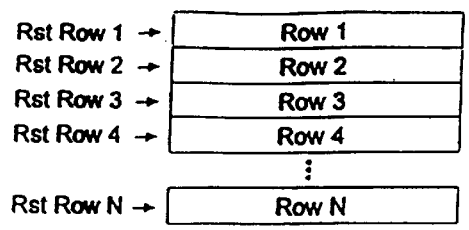
FIGS. 6A and 6B are timing diagrams showing the timing sequence for an array of N rows configured with a known 3T pixel.
Figure 6B:
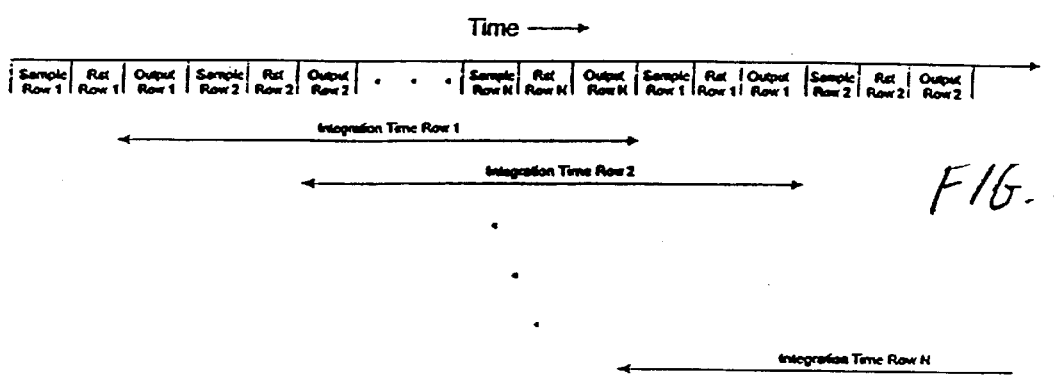

In a conventional CMOS "3T" pixel, the photosite is both the charge collection site and the sense node. Consequently, when operating at the maximum readout speed, the integration time is the time interval between successive reads of the same row as depicted in FIGS. 6A and 6B. The integration time period for each row begins and ends at a different time so that a "rolling shutter" is created. Note the staggered integration times depicted in FIG. 6B. If a single exposure were collected of a fast-moving scene (e.g. a pencil being waved back and forth rapidly in front of the camera), the stored image would not display a straight pencil, but rather a curvy pencil since different rows were exposed while the pencil was in different locations. It follows that an external shutter must be used with a conventional CMOS image to capture fast-changing scenes.

The "5T" pixel eliminates the rolling shutter artifact by constructing each pixel to have a separate well for integration of photocharge (i.e., junction 14) and for the storage of the charge collected during a frame (i.e., junction 18). The storage node (also called the sense node) is light-shielded, hence the amount of charge stored on the storage/sense node is unaffected by the image light which falls on the sensor.

Figure 2B:
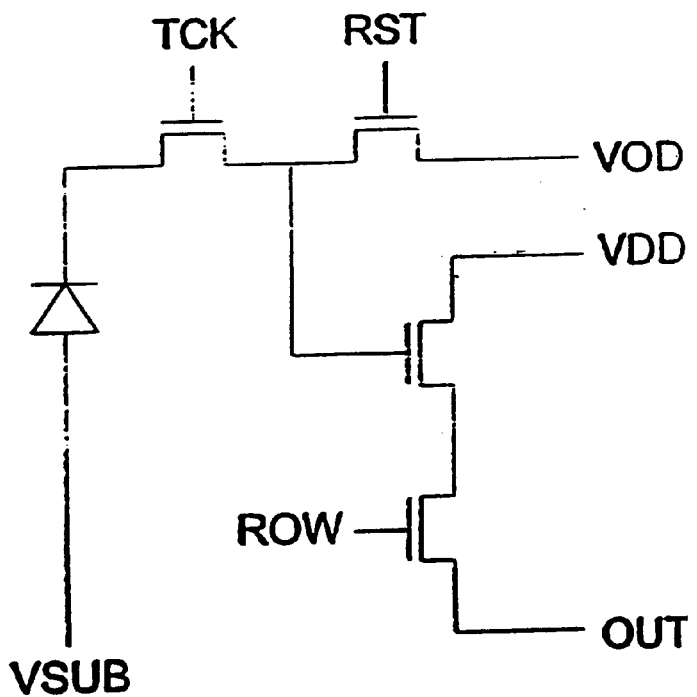
Figure 5A:
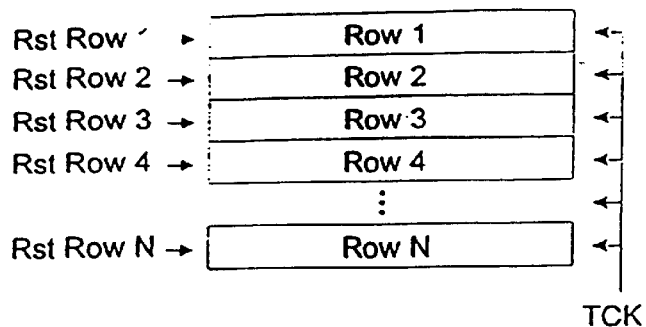
FIGS. 5A and 5B are timing diagrams showing the timing sequence for an array of N rows configured with a known 4T pixel.
Figure 5B:
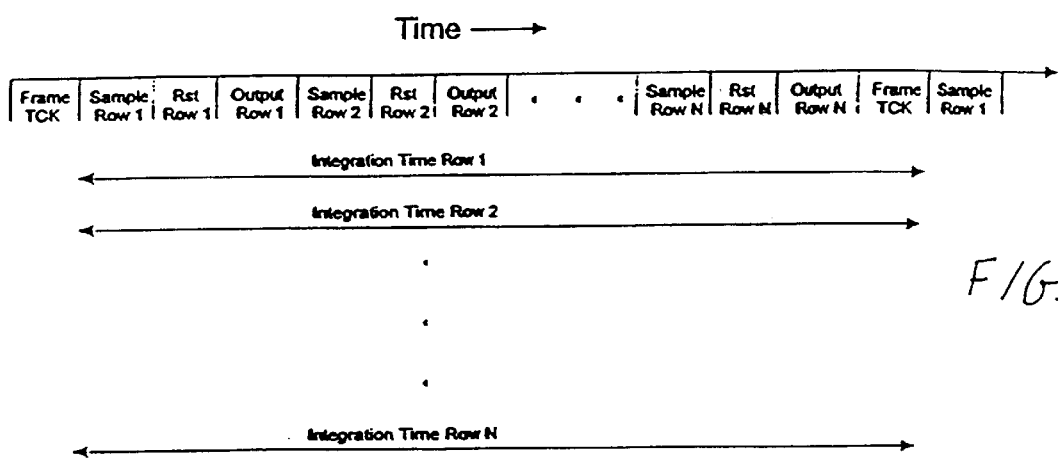

The rolling shutter artifact can also be eliminated with a "4T" pixel array (FIG. 2B) as illustrated in FIGS. 5A and 5B. However, antiblooming functionality may not be achieved at the same time. Here the transfer gate transistors are all clocked at the same time and the charges in the photosites are transferred within the pixels to respective pixel sense nodes. If the sense node is light-shielded, the charges on the sense nodes can be read out at any time during the time interval when the next frame image is being integrated.

A problem with this known 4T arrangement is that the minimum duration of the charge-collection time (integration time) in the photosite is fixed to, and defined by, the readout time for the array. This may be too long of an exposure time for fast-moving scenes. However, this problem can be worked around to some degree.

After the array is read out, in the 4T pixel, the transfer gate electrodes and reset gate electrodes are all turned on and then turned off to preset the photodiode potentials on all photosites. The photosites can then collect charge for an arbitrarily short period before doing a frame transfer operation, after which, the photocharge can be subsequently readout.

The limitation with this approach is that the maximum effective frame rate is necessarily reduced. Another issue with using a known "4T" pixel in this manner is that, for high scene illumination (which is usually the case when imaging fast-moving scenes), any particular photosite may fill to capacity during the frame readout operation. The charge will then spill out of the photosites (i.e., a blooming effect) and contaminate the signal on the sense node still to be read out. The 4T pixel can be clocked to allow for antiblooming and exposure control functionality, but not without contaminating the charge stored on the storage/sense node.

In contrast, the "5T" pixel adds a dedicated exposure control gate transistor 22 and, therefore, allows for non-rolling shutter operation and for antiblooming and exposure control functionality at the same time. Note that a "5T" pixel can be made to behave like a "4T" pixel by holding the exposure control gate transistor inactive, and can be made to behave as a "3T" pixel by holding the exposure control gate transistor inactive while always holding the transfer gate transistor active.

A 5T pixel without a pinned photodiode as photodiode 12 advantageously uses a hard/soft reset process to minimize fixed pattern noise. The most straightforward approach to reset photosite 14 would be to hold VPR high, to then clock the voltage EC to a high level and then back to a low level. When voltage EC is high, charge in the photosite will spill to the VPR drain until the voltage on the photosite is equal to the high voltage of voltage EC minus the threshold voltage of exposure control transistor 22. By arranging the high-level EC on the gate electrode of the exposure control transistor so that it is slightly lower than the high level on clock voltage TCK, in a related process of operating the 5T pixel, the pixel clocking processes will always transfer some charge to the storage node when clock voltage TCK is clocked high. This "extra" charge is referred to as the "fat zero" charge.

The photosite operation as described above is referred to as a "soft" reset. The "soft" reset is defined to be when the level to which the photosite adjusts during reset is governed by subthreshold current flow across the preset transistor (exposure control transistor 22 in FIG. 1). Hence the final voltage on the photosite is a function of the duration of the voltage EC high pulse and of the voltage level on the photosite just prior to clocking the voltage EC high. The dependence on the prior voltage level results in an undesired phenomenon known as image lag, since the final voltage on the photosite is, in part, a function of the voltage on the photosite before reset.

An alternative way, and a preferred way to reset a photosite is this hard/soft reset process of operating a 5T pixel with a conventional photodiode. To reset the photosite, clock the voltage EC high and then low while voltage VPR is maintained at a sufficiently low voltage that the potential beneath the preset gate electrode (transistor 22) becomes larger than voltage VPR during the reset operation (i.e., current freely flows between drain VPR and the photosite and is not limited by a subthreshold voltage of a transistor). This ensures that the voltage on the photosite becomes exactly voltage VPR. This is referred to as a "hard" reset.

However, the transfer across transfer gate transistor 16 (FIG. 1) is still "soft" in nature (i.e., after a transfer, the photosite voltage will adjust to a voltage equal to the high TCK voltage minus the threshold voltage of the transfer gate transistor). Therefore, the collected charge transferred to junction 18 (sense node, storage node or storage site) is still "soft". Since the threshold voltages of transistors vary across the chip, the magnitude of the fat zero signal will vary across the chip. This phenomenon is known as fixed pattern noise (FPN). The preferred hard/soft reset operation of the 5T pixel with a conventional photodiode takes advantage of the fact that spatial variations in the threshold voltage of transistors will be smaller for closely-spaced transistors than for transistors that are widely separated.

Figure 3D:
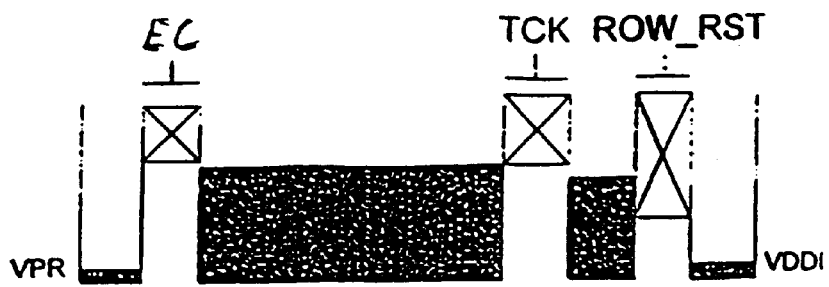
FIGS. 3D through 3H are potential diagrams illustrating a hard and soft reset sequence of a 5T pixel.
Figure 3E:
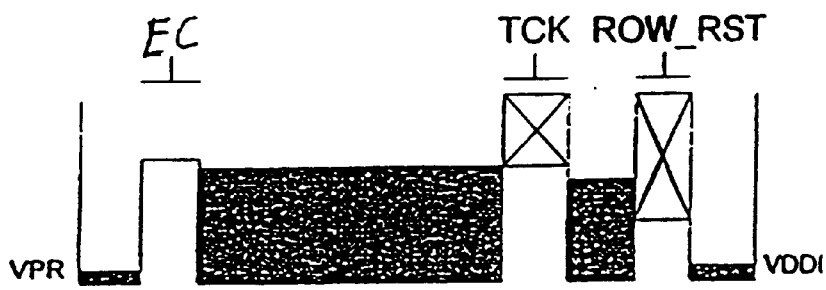
Figure 3F:
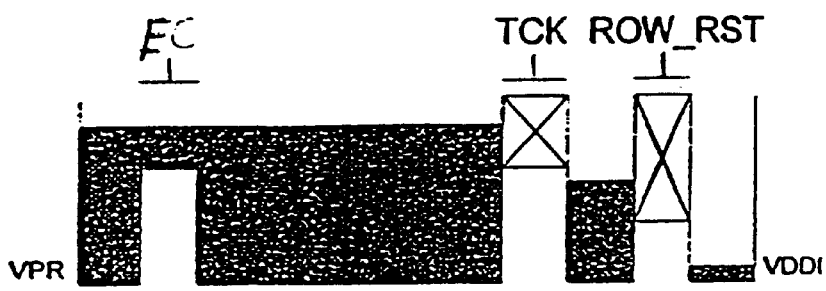
Figure 3G:
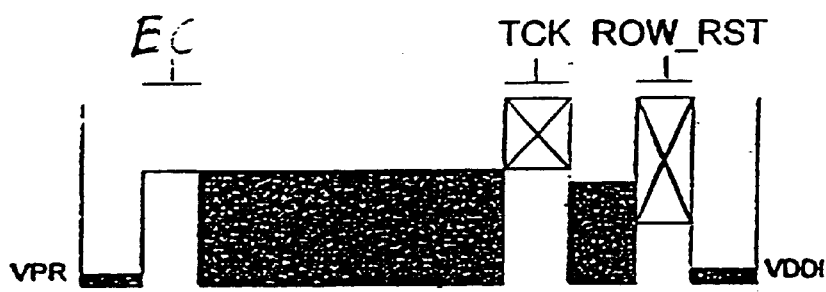

Thus, the preferred hard/soft reset operation of the 5T pixel with a conventional photodiode is to perform a "hard" reset immediately followed by a "soft" reset, as illustrated in FIGS. 3D through 3H. FIG. 3D illustrates the potential in the pixel immediately after the signal charge transfer from the photosite to the sense node. In FIG. 3E, the photosite reset begins when voltage EC is clocked high. Note that the high level on voltage EC is just slightly lower than the high level on voltage TCK. In FIG. 3F, preset voltage VPR is clocked low. Electron charge transfers into the photosite (i.e., "fills") until the photosite to be reset has a voltage equal to voltage VPR (i.e., a "hard" reset). In FIG. 3G, voltage VPR is clocked high again, at which point excess electron charge is spilled from the photosite into drain VPR ("soft" reset) and drained away. This intentionally sets the photosite level to a level that is proportional to the local value of the preset transistor (transistor 22) threshold voltage. Since spatial variations in the threshold voltage of transistors will be smaller within a single pixel than across the array, the portion of the "soft" preset voltage attributed to the preset transistor threshold will be substantially removed later during readout by the threshold voltage of transfer gate transistor 16. The duration of the high pulse to the EC clock is to be substantially equal to the duration of the high pulse on the TCK gate after integration to ensure that lag is minimized. This "hard/soft" reset sequence eliminates lag due to the reset operation, and minimizes the variations across the array in the magnitude of the fat zero signal (i.e., reduces FPN) that would be present in pixels using conventional photodiodes.

Figure 3H:
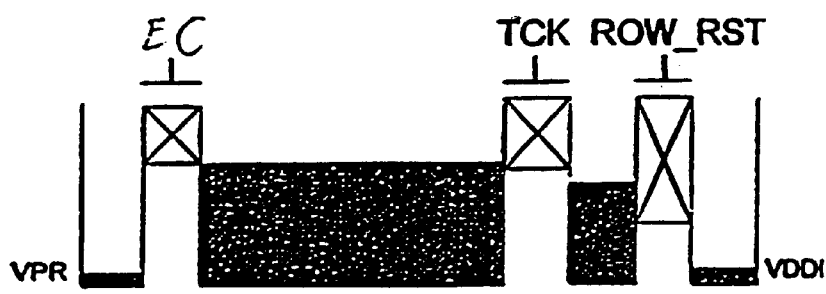
Figure 4A:
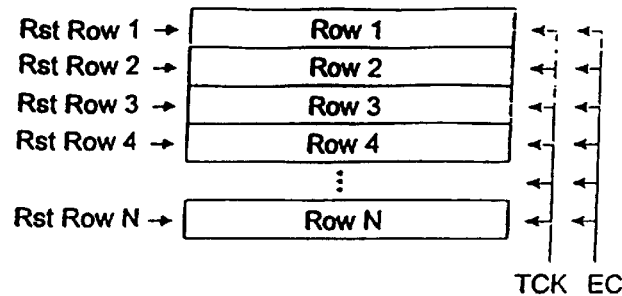
FIGS. 4A and 4B are timing diagrams showing the timing sequence for an array of N rows configured with a 5T pixel of the present invention.
Figure 4B:
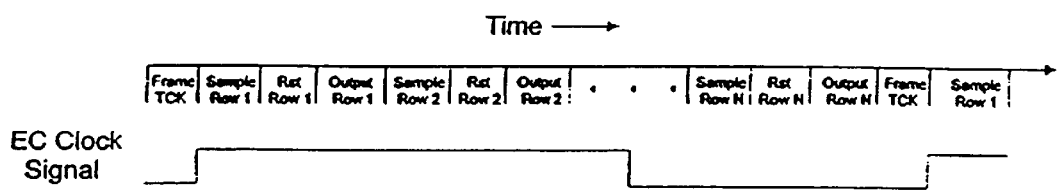

In FIG. 3H, photocharge integration is resumed. Without this hard/soft reset approach in 5T pixels with a conventional photodiode, the user either sees large FPN (i.e., hard reset only) or sees large image lag (i.e., soft reset only). Note that the sense node can be "hard" reset independently of what type of reset operation is used for the photosite.

The most flexible arrangement to achieve this process is illustrated in FIG. 1. However, in an alternative embodiment, some biases may be ganged together (e.g., voltage VOD and/or voltage VPR may be tied to voltage VDD). A hard reset can be ensured by setting the output drain voltage VOD to be lower than the high level of the channel voltage beneath reset gate transistor 20.

In a 5T pixel with a conventional photodiode, in FIG. 7A, at time T1, voltage EC is at its high level while voltage VPR is low so that the photosite is filled with charge. In FIG. 7B, at time T2, voltage EC returns to its low level to isolate the charge in the photosite from drain VPR. In FIG. 7C, at time T3, charge accumulates in the isolated photosite during the integration period. In FIG. 7D, at time T4, voltage TCK becomes high to cause accumulated photocharge to transfer to the sense node from the photosite. In FIG. 7E, at time T5, voltage TCK becomes low and the sense node becomes isolated from the photosite. In FIG. 7F, at time T6, the readout cycle begins. In FIG. 7G, at time T7 after the readout cycle ends (at least it ends for the particular pixel), the sense node (junction 18) is reset to the high clock level on signal RST minus a VT by pulsing voltage RST to a high voltage to turn on reset transistor 20. In FIG. 7H, at time T8, voltage RST returns to a low voltage to again isolate the sense node from output drain voltage VOD. During the end of the cycle (T6, T7 and T8) and in the beginning of the cycle (TI), voltage EC is maintained at a high level and preset voltage VPR is maintained at a low level so that the photosite is "hard" reset to a level of preset voltage VPR at its low level.

Persons skilled in the art will appreciate in light of these teachings that plural pixels, as described above, are incorporated into a sensor that includes control circuitry to control the pixel operations. Persons skilled in the art, in light of these teachings, will appreciate that the construction of control circuitry sufficient to generate the clock signals and control voltages at the above-described voltage levels and with the above-described timing to affect the operation of the sensor can be made or adapted from known control circuits.

The above-described pixel is suitable for non-rolling shutter and non-rolling shutter with antiblooming and exposure control applications. It is suitable for low lag and low fat zero FPN applications independent of non-rolling shutter operation. It is suitable for use in any area device for high-speed motion capture.

In an alternative embodiment, the 5T pixel is implemented with a photodetector constituted by a pinned photodiode (PPD) so that the photosite can be fully depleted of charge upon charge transfer from the photosite through the sense node (or storage node or storage site) and/or from the photosite through the exposure control transistor to a drain. In this embodiment, the photodetector is implemented with an N well implanted region (as in a buried channel configuration) or an N+ implanted region overlayed with a p+ pinning region. The capability of the pinned photodiode to become void of charge eliminates issues associated with fat zeros, image lag, and importantly, removes sensitivity to pixel-to-pixel variations in the threshold voltage beneath the transfer gate transistor gate electrodes that show up as fixed pattern noise.

Figure 8:
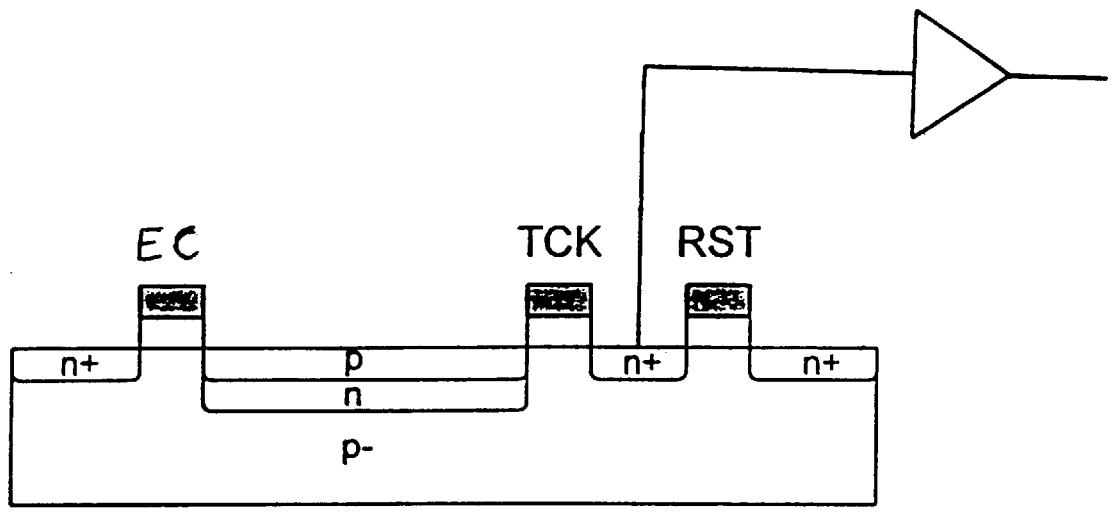
FIG. 8 is an implant and gate cross section for a 5T pixel with a pinned photodiode (PPD) photosite and the required doping regions.
Figure 9:
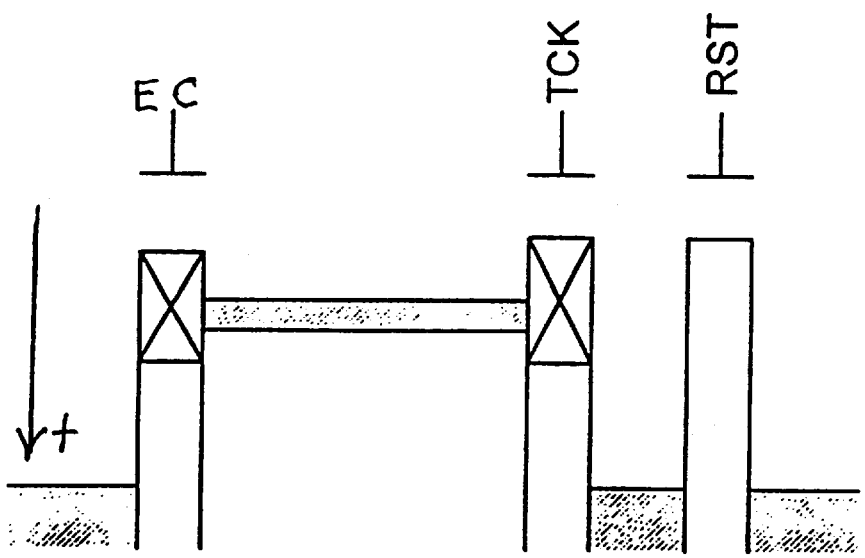
FIG. 9 is a potential diagram of the photosite and sense mode of the PPD used in the 5T pixel.

A cross-section of the pixel with a pinned photodiode is illustrated in FIG. 8. The potential diagram of the sectional structure of FIG. 8 is depicted in FIG. 9. The photosite, which is the region between the EC and TCK gates, is comprised of a 'p on n on p' pinned photodiode in a 5T pixel with operating potentials as defined herein. Through considered selection of the implant doses that produce the doping profile, the n region can be completely voided of majority carriers while at the same time the p surface region remains pinned to the substrate (i.e., the p surface region is not fully voided of carriers and is electrically connected to the substrate through a connection out of the plane of the figure and hence not shown). The photosite (e.g., the n region of the PPD) can be fully voided of its majority carriers by draining the majority carriers in the n region (electrons) across the EC gate to an adjacent drain and/or across the TCK gate to an adjacent storage node. With consideration of the selected implant doses, this can be accomplished with a low voltage applied to the EC and/or TCK gate electrodes. The full voiding of the n region of a pinned photodiode of majority carriers simplifies the operation of the 5T pixel by obviating any need to implement a hard/soft rest operation.

The photosite can be "reset" to zero carriers (electrons) every time. This "perfect" reset cannot be accomplished in photosites constructed from simple or conventional diodes (e.g., n region on p substrate).

In photosites with simple conventional diodes, there is an uncertainty in the charge left on the diode after a reset (the so-called KTC noise or reset noise). The imperfect emptying of the photosite across the TCK gate also contributes to the artifact known as both image lag and photosite transfer loss. Image lag is a phenomenon arising from a conventional photodiode. The image lag phenomenon in a pixel with a conventional photodiode can be understood from an example where a bright spot is imaged followed by a dark spot. The bright spot fills the photodiode with charge. At the proper time in the readout cycle, the TCK gate turns on, and the photo charge passes through the TCK gate into the storage node with an exponential current due to the resistance of the TCK gate and the capacitance of the storage node that forms an RC time constant. When the TCK gate finally turns off, a small amount of charge remains in the conventional photodiode. However, when the following dark spot is imaged, this small amount of remaining photo charge in the photo diode looks like a signal generated during the time period that the dark spot is imaged, but it is actually an image lag signal from the prior bright spot. This is the nature of the image lag problem.

The fat zero mode of operation overcomes the image lag phenomenon. Charge is first flooded into the conventional photodiode of each pixel through the TCK gate (or the EC gate) as if it were generated from a bright spot. Then, the charge is drained away through the TCK gate into the storage node and from there into a high potential drain. In this way, any image lag that may have been present from a prior imaging cycle is first flooded, then reset, and all pixels will have some residual charge that is added to the subsequent image. This residual charge is the so-called fat zero.

The fat zero mode has its own problems. There are small differences in the threshold of TCK gate transistors formed in a sensor resulting from slight processing variations. In a four transistor pixel, charge first floods through the TCK gate into the photodiode, then is drawn back out of the conventional photodiode through the TCK gate through the storage node and from there through a reset transistor into a high potential drain. The charge left in the photodiode varies due to the variations in the thresholds of the TCK gate transistors. Since the TCK gate transistor threshold varies across the sensor, the potential remaining on each conventional photodiode also varies in a pattern defined by the TCK gate transistor threshold variation. This variation in the potential on each photodiode results in fixed-pattern noise.

The inclusion of both the EC and TCK gates in a 5T pixel allows for robust functionality. In particular, the TCK gate allows the photosite 14 to be decoupled from the charge storage region 18 between the TCK and RST gates. This region can be thought of as the sense/storage node region. Photocharge is accumulated in the photosite during an exposure. At the end of the exposure, the photocharge in each and every photosite is transferred to a corresponding sense/storage node in each and every corresponding pixel at the same time. Thereafter, charge from the next exposure accumulates in the photosite while the charge on the sense/storage node is read out on a row by row basis. This eliminates the "rolling shutter" artifact that makes 3T pixels inappropriate for the capture of rapidly changing scenes (i.e. high-speed image capture).

The inclusion of the TCK gate turns a 3T pixel into a 4T pixel. Inclusion of a fifth transistor, the EC gate, turns the 4T pixel into a 5T pixel. This allows for antiblooming and exposure control as well as a snap shot mode to eliminate the rolling shutter artifact. In antiblooming mode, charge which is added to an already full photosite and is drained away across the EC gate (set at an appropriate antiblooming threshold) into a drain before it can couple into adjacent pixels. In exposure control mode, the photosite is held in a photosite reset mode (e.g., with EC biased high) until the exposure is to begin creating a shortened photo integration period. This allows for effective exposure times that are less than the minimum frame time (as determined by the time required to read out the previous frame from the storage/sense nodes). This permits high speed operation in bright lights.

In a 5T pixel, there are also small differences in the threshold of EC and TCK gate transistors formed in a sensor. The signal applied to the TCK gate electrode is made to be slightly more positive than the signal applied to the EC gate electrode in order to ensure that some charge will always transfer from the conventional photodiode of the pixel to the storage node when reading the photodiode. Otherwise, the variation in threshold between the EC and TCK gate transistors may be such that the EC gate (during exposure control mode) resets the potential of the conventional photodiode to a level so positive (i.e., draws off so much negative photo charge) that the conventional photodiode will have a potential deficit with respect to the potential under the TCK gate electrode due to the threshold of the TCK gate.

To overcome this deficit, when and if it occurs, a conventional photodiode will have to generate additional photo charge just to bring the conventional photodiode's potential sufficiently negative that further photo charge can cross the threshold of the TCK gate transistor and be drawn off to a higher potential drain (e.g., the storage node). This additional amount of photo charge, that must be generated before charge transfer can occur, can never be read out of the conventional photodiode, and this deficit behaves as if it were a negative form of fat zero. Since the thresholds of the EC and TCK gate transistors vary across the sensor, this resulting negative form of fat zero also varies across the sensor, and these variations also result in fixed pattern noise.

In order to address this problem, the present invention uses a pinned photodiode (PPD) in a five-transistor pixel. The PPD is reset through the EC gate (exposure control gate) to a potential inherent to the empty PPD. During the time the EC gate is on, all photo charge (the electrons trapped in the N region of the PPD) is drawn out of the N region and taken away by a positive potential on a drain. Then, the EC gate is turned off to begin the charge integration cycle. When the integration cycle is over, all photo charge (the electrons trapped in the N region of the PPD) is transferred through the TCK gate to the storage node.

Advantages of the inventive procedure include that simplified control circuitry 2 may be used since the hard/soft reset procedures are not necessary, that there is no chance for image lag or fixed pattern noise since all charge in the PPD is cleared before integration, and that all charge in the PPD after the integration is transferred to the storage node.

One of the several qualities of a PPD that make it the photosite of choice for the 5T pixel is that the PPD allows for a "perfect" reset (i.e., complete reset) of the photosite. The photosite is completely cleared of charge and hence eliminates the cause of image lag. That the photosite can be fully drained of charge means that there is no variation from pixel to pixel in the potential level on the photosite that corresponds to no illumination of the pixel.

Ordinarily, there are small differences in the threshold voltage between the TCK and EC gate transistors in any particular pixel. The application of otherwise equivalent high clock pulses to the EC and TCK gate electrodes produces different voltages on a photosite comprised of a conventional diode. Thus, for operation with a conventional photodiode, the pixel requires that (a) the voltage level of the signal applied on the TCK gate electrode be slightly different than on the EC gate electrode so as to ensure that some charge is transferred (the so-called fat zero mode of operation) from the photosite to the storage node and (b) that the user tolerate the fixed pattern noise (FPN) that is produced. For example, when the storage node and photosite are constituted by n regions formed in a p substrate, the pixel requires that (a) the high level of the signal applied on the TCK gate electrode be slightly higher than on the EC gate electrode to ensure that some charge is transferred (the so-called fat zero mode of operation) from the photosite to the storage node and (b) that the user tolerate the fixed pattern noise (FPN) that is produced.

In contrast, with a PPD photosite, the photosite can be fully emptied of charge (perfectly reset) by both the TCK and EC gate transistors thereby eliminating the FPN that would otherwise result from exposure control operation. Control circuitry 2 is simplified since it does not need to mechanize a hard/soft reset. With a PPD photosite, there is no need to clock voltage VPR, and there is no need to do a hard/soft reset.

Another advantage of using a PPD over a conventional diode is that the depletion region can be made to extend more deeply into the silicon. This greatly reduces electronic cross talk whereby photocharge migrates through the substrate to end up in adjacent pixels, thereby being registered as a false signal.

Persons of ordinary skill in the art in light of these teachings will appreciate that N implants in a P substrate produces photodiodes of a first conductivity type and P implants in an N substrate produces photodiodes of a second conductivity type. Persons of ordinary skill in the art in light of these teaching will appreciate that the pixels described herein may advantageously be made of either conductivity type.

The use of a PPD photosite enables a sensor to obtain low FPN and low lag operation with a 5T pixel even if there are small differences in transistor thresholds across the sensor.

An embodiment of the present invention is a pixel that includes five transistors 16, 20, 22, 24, 28, a pinned photodiode 12 and a storage node 18. A first transistor 16 is coupled between the pinned photodiode 12 and the storage node 18. A second transistor 20 is coupled between the storage node 18 and an output drain voltage VOD. A third transistor 22 is coupled between the pinned photodiode 12 and a pixel preset voltage VPR. In an alternative embodiment, the pixel preset voltage VPR is different than the output drain voltage VOD.

Figure 10:
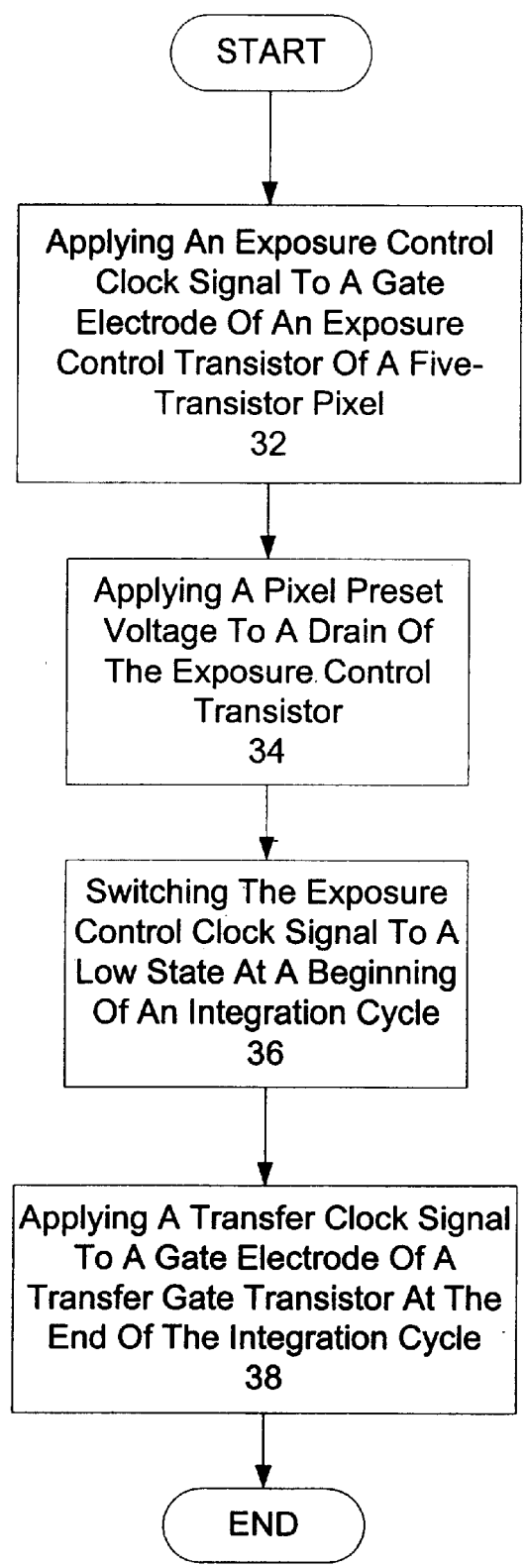
FIGS. 10–14 are flow charts depicting methods of the present invention.

With reference now to FIG. 10, a method 30 of sensing radiation in a pixel according to the present invention is shown. The method 30 includes steps of applying (step 32) an exposure control clock signal (EC in FIG. 1) to a gate electrode of an exposure control transistor (22 in FIG.1) of a five-transistor pixel, applying (step 34) a pixel preset voltage (VPR in FIG. 1) to a drain of exposure control transistor 22 that is coupled between a pinned photodiode (12 in FIG. 1) and the preset voltage (VPR in FIG. 1), and switching (step 36) the exposure control clock signal EC to turn off the exposure control transistor at a beginning of an integration cycle after substantially all signal charge has drained out of the pinned photodiode 12 and across the exposure control transistor 22 so that the pinned photodiode 12 is fully voided of majority carriers. As seen in FIG. 10, the method 30 of an alternative embodiment also includes a step of applying (step 38) a transfer clock signal (TCK in FIG. 1) to a gate electrode of a transfer gate transistor (16 in FIG. 1) at an end of the integration cycle. Step 38 causes integrated signal charge to transfer from the pinned photodiode 12 to a storage node so that the photosite is fully voided of majority carriers.

Figure 11:
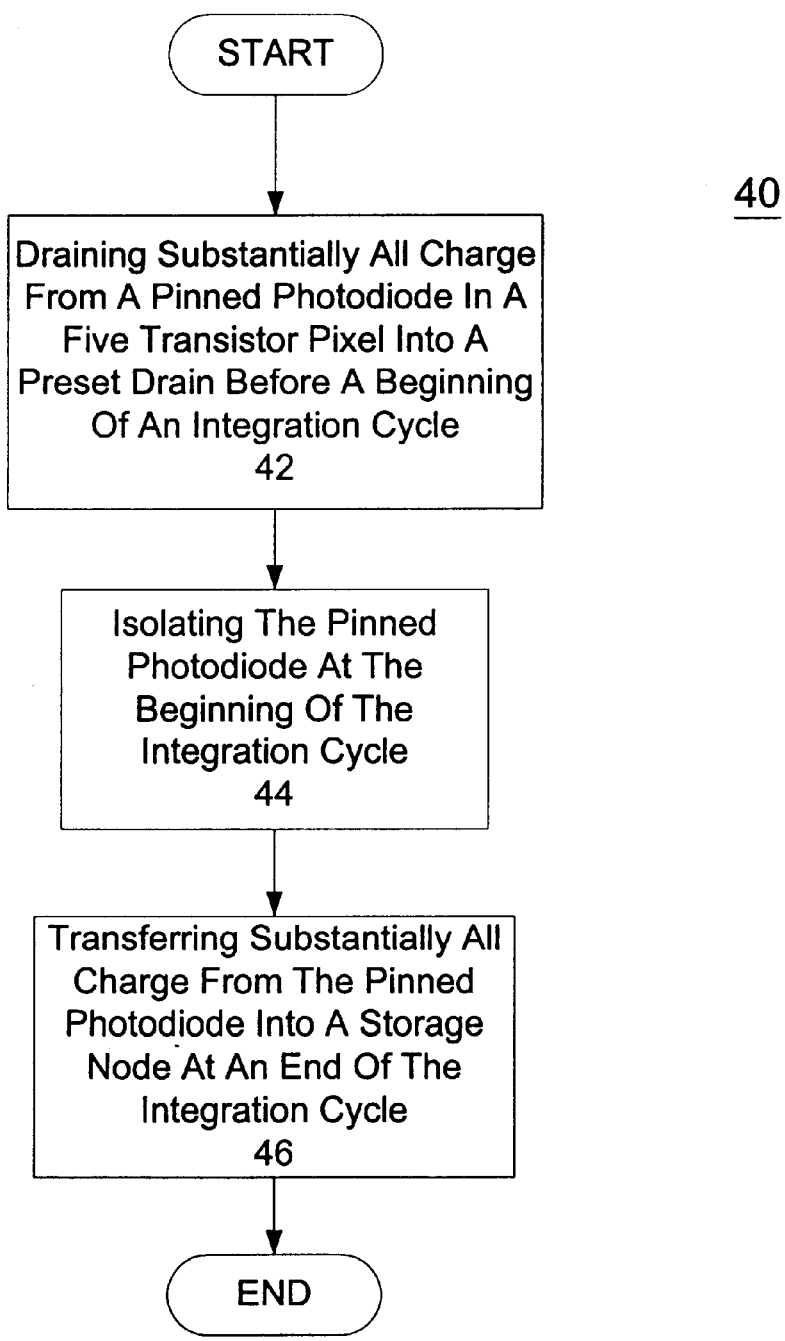

With reference now to FIG. 11, method 40 includes steps of draining (step 42) substantially all charge from a pinned photodiode (12 in FIG. 1) in a five transistor pixel into a preset drain before a beginning of an integration cycle and isolating (step 44) the pinned photodiode 12 at the beginning of the integration cycle. Method 40 also includes a step of transferring (step 46) substantially all charge from the pinned photodiode 12 into a storage node (18 in FIG. 1) at an end of the integration cycle. The step of draining (step 42) may include applying an exposure control clock signal (EC in FIG. 1) to a gate electrode of an exposure control transistor (22 in FIG. 1) in the five transistor pixel. Likewise, the step of transferring (step 46) may include applying a transfer clock signal (TCK in FIG. 1) to a gate electrode of a transfer gate transistor (16 in FIG. 1) in the five transistor pixel.

Figure 12:
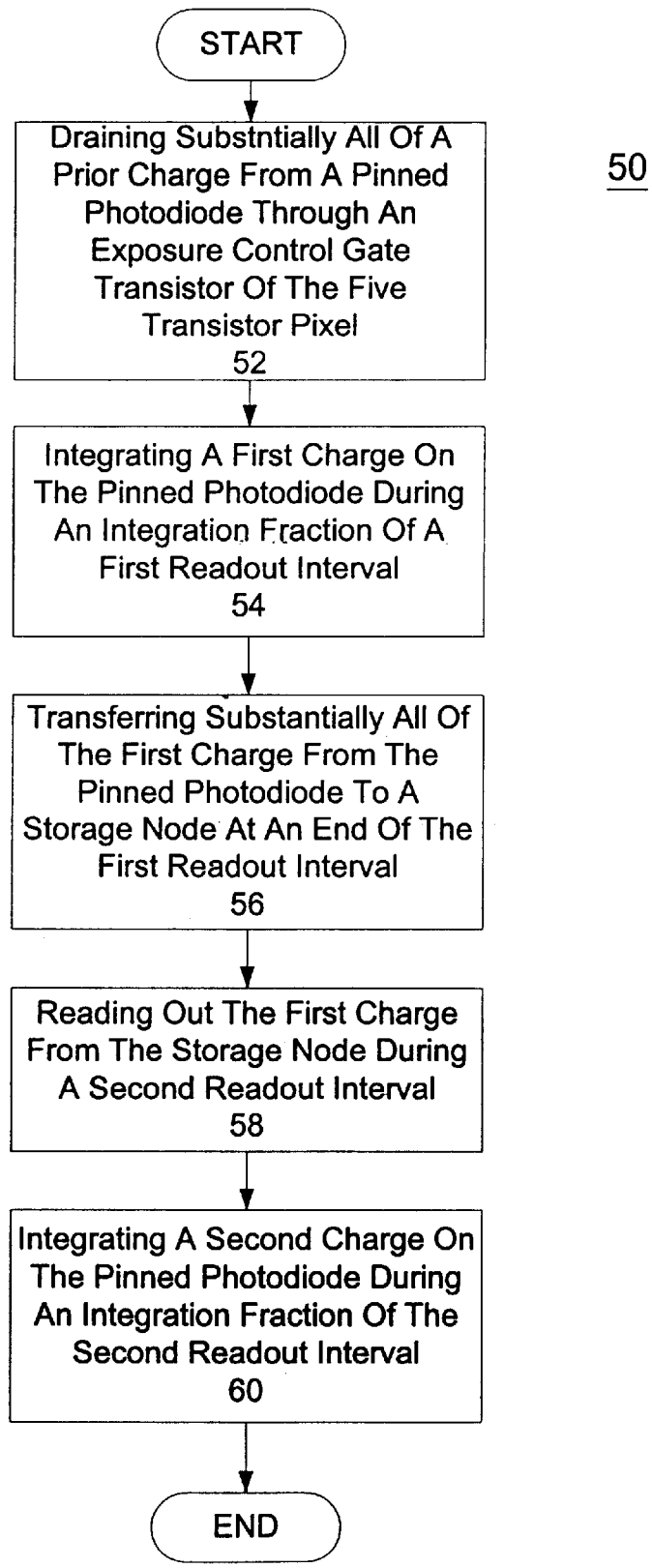

With reference now to FIG. 12, a method 50 of using a five transistor pixel is shown. The method 50 includes steps of draining (step 52) all of a prior charge from a pinned photodiode (12 in FIG. 1) through an exposure control gate transistor (22 in FIG. 1) of the five transistor pixel and integrating (step 54) a first charge on the pinned photodiode 12 during an integration fraction of a first readout interval. The integration fraction may be and typically is less than a whole of the first readout interval. In this way, bright fast moving scenes can be imaged in a short time interval, and a large array of pixels may be read out over a longer interval.

For example, the integration fraction may be 50% (or 25% or 10%) of the readout interval. As shown in FIG. 12, an alternative embodiment of the method 50 also includes a step of transferring (step 56) substantially all of the first charge from the pinned photodiode 12 to a storage node (18 in FIG. 1) at an end of the first readout interval. Likewise, in an alternative embodiment, the method 50 also includes steps of reading out (step 60) the first charge from the storage node during a second readout interval and integrating (step 60) a second charge on the pinned photodiode 12 during an integration fraction of the second readout interval.

Figure 13:
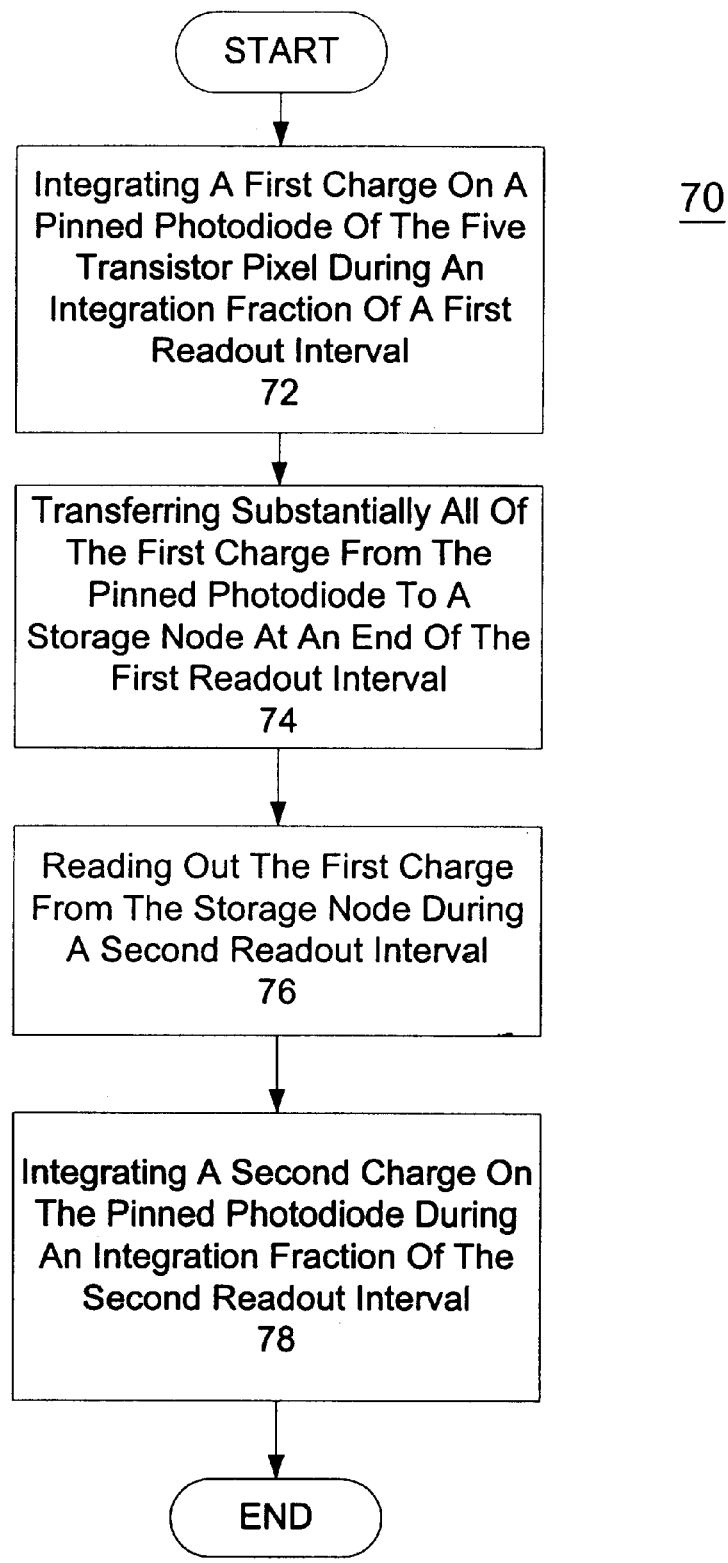

With reference to FIG. 13, in another embodiment, method 70 for using a five transistor pixel includes steps of integrating (step 72) a first charge on a pinned photodiode (12 in FIG. 1) of the five transistor pixel during an integration fraction of a first readout interval and transferring (step 74) substantially all of the first charge from the pinned photodiode to a storage node (18 in FIG. 1) at an end of the first readout interval. The integration fraction may be less than a whole of the first readout interval. In this way, bright fast moving scenes can be imaged in a short time interval, and a large array of pixels may be read out over a longer interval. For example, the integration fraction may be 50% (or 25% or 10%) of the readout interval. As shown in FIG. 13, an alternative embodiment, the method 70 also includes steps of reading out (step 76) the first charge from the storage node 18 during a second readout interval and integrating (step 78) a second charge on the pinned photodiode 12 during an integration fraction of the second readout interval.

In FIG. 1, an embodiment of the present invention is a sensor that includes control circuitry 2 and a pixel that includes five transistors 16, 20, 22, 24, 28, a pinned photodiode 12 and a storage node 18. In the sensor, a first transistor 16 is coupled between the pinned photodiode 12 and the storage node 18. Additionally, a second transistor 20 is coupled between the storage node 18 and an output drain voltage VOD. Further, a third transistor 22 is coupled between the pinned photodiode 12 and a pixel preset drain voltage VOD. The control circuitry 2 is capable of controlling the third transistor 22 to drain substantially all of a prior charge from the pinned photodiode 12 by applying a positive EC signal and a more positive VPR voltage. Moreover, the control circuitry is further capable of controlling the first transistor 16 and the third transistor 22 to integrate a first charge on the pinned photodiode 12 during an integration fraction of a first readout interval by applying a voltage to the EC and TCK signals to turn off transistors 16 and 22. In an alternative embodiment, the control circuitry further is capable of controlling the first transistor 16 to transfer substantially all of the first charge from the pinned photodiode 12 to the storage node 18 at an end of the first readout interval by applying a positive TCK pulse. In an alternative embodiment, a fourth transistor 24 is coupled between the storage node 18 and an output OUT through fifth transistor 28 to buffer the first charge in the storage node 18 and provide the output OUT during a second readout interval. In an alternative embodiment, a gate electrode of such a fourth transistor 24 is coupled to the storage node 18 and a source of the fourth transistor 24 is coupled to the output OUT through transistor 28.

Figure 14:
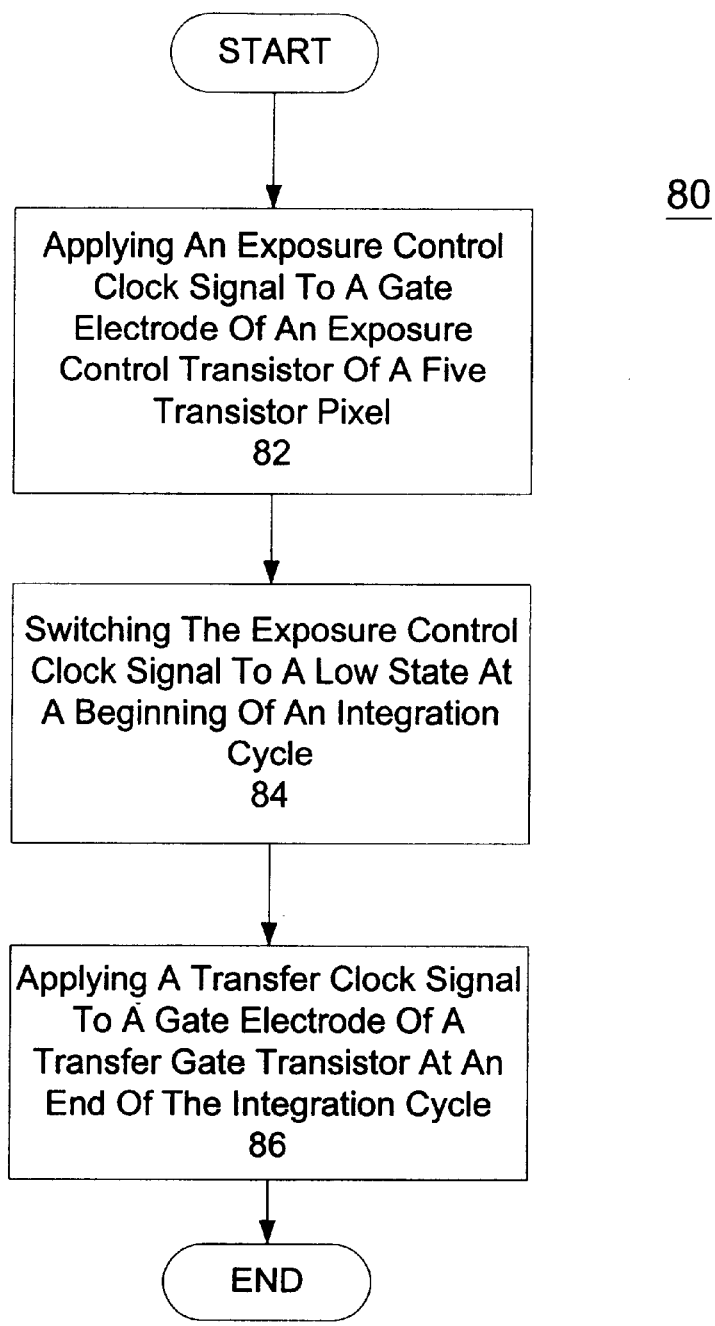

With reference now to FIG. 14, in an alternative embodiment, method 80 includes steps of applying (step 82) an exposure control clock signal (EC in FIG. 1) to a gate electrode of an exposure control transistor 22 of a five transistor pixel 16, 20, 22, 24, 28, switching (step 84) the exposure control clock signal EC to turn off the exposure control transistor at a beginning of an integration cycle, and applying (step 86) a transfer clock signal (TCK in FIG. 1) to a gate electrode of a transfer gate transistor 16 at an end of the integration cycle. The step of applying (step 86) the transfer clock signal TCK preferably causes the transfer gate transistor 16 to transfer substantially all of an integrated signal charge from a pinned photodiode (12 in FIG. 1) to a storage node (18 in FIG. 1).

"Substantially all" (of the charge), as used herein, does not mean absolutely all. Thermal generated charges or stray photo generated charges may still exist. There are many design details that need to be considered in the generation of a photosite that can call for complete charge transfer. In general, the biggest contributions to incomplete charge transfer are not from thermally generated charges or stray charges, but rather from pockets and barriers in the potential profile at the interface between the photosite and the transfer gates. It can take a great deal of trial and error, and often tricks like angled implants, to remove all pockets and barriers. However, the transfer of charges from the pinned photodiode is not impeded by the threshold voltages of the transistors used in the transfer.

Having described preferred embodiments of a novel pinned photodiode pixel (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A pixel comprising five transistors, a pinned photodiode and a storage node, wherein:

a first transistor is coupled between the pinned photodiode and the storage node;

a second transistor is coupled between the storage node and an output drain voltage; and a third transistor is coupled between the pinned photodiode and a pixel preset voltage.

2. The pixel of claim 1, wherein the pixel preset voltage is different than the output drain voltage.

3. The pixel of claim 2, further comprising a fourth transistor having a fourth transistor drain and a fourth transistor gate electrode, wherein:

the fourth transistor gate electrode is coupled to the storage node; and a voltage applied to the fourth transistor drain is different than the output drain voltage.

4. The pixel of claim 2, further comprising a fourth transistor having a fourth transistor drain and a fourth transistor gate electrode, wherein:

the fourth transistor gate electrode is coupled to the storage node; and the fourth transistor drain is coupled to the output drain voltage.

5. The pixel of claim 1, further comprising a fourth transistor having a fourth transistor drain and a fourth transistor gate electrode, wherein:

the fourth transistor gate electrode is coupled to the storage node;

the fourth transistor drain is coupled to the output drain voltage; and the pixel preset voltage is substantially equal to the output drain voltage.

6. A sensor comprising control circuitry and a pixel that includes five transistors, a pinned photodiode and a storage node, wherein:
   a first transistor is coupled between the pinned photodiode and the storage node;
   a second transistor is coupled between the storage node and an output drain voltage;
   a third transistor is coupled between the pinned photodiode and a pixel preset drain voltage;
   the control circuitry is capable of controlling the third transistor to drain substantially all of a prior charge from the pinned photodiode; and
   the control circuitry is further capable of controlling the first and the third transistor to integrate a first charge on the pinned photodiode during an integration fraction of a first readout interval.

7. The sensor of claim 6, wherein the control circuitry is further capable of controlling the first transistor to transfer substantially all of the first charge from the pinned photodiode to the storage node at an end of the first readout interval.

8. The sensor of claim 7, wherein a fourth transistor is coupled between the storage node and an output to buffer the first charge in the storage node and provide the output during a second readout interval.

9. The sensor of claim 8, wherein:
   a gate electrode of the fourth transistor is coupled to the storage node; and
   a source of the fourth transistor is coupled to the output.

* * * * *